(12) United States Patent
Nguyen et al.

(10) Patent No.: US 8,586,487 B2
(45) Date of Patent: Nov. 19, 2013

(54) LOW TEMPERATURE PLASMA ENHANCED CHEMICAL VAPOR DEPOSITION OF CONFORMAL SILICON CARBON NITRIDE AND SILICON NITRIDE FILMS

(75) Inventors: Victor Nguyen, Novato, CA (US); Mihaela Balseanu, Sunnyvale, CA (US); Li-Qun Xia, Cupertino, CA (US); Derek R. Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 13/353,063

(22) Filed: Jan. 18, 2012

(65) Prior Publication Data

US 2013/0183835 A1  Jul. 18, 2013

(51) Int. Cl.
*H01L 21/469* (2006.01)
(52) U.S. Cl.
USPC ............ 438/791; 438/792; 438/778; 438/783
(58) Field of Classification Search
USPC ......... 438/758, 762, 765, 769, 771, 772, 775, 438/777, 778, 783, 788, 791, 792; 257/E21.293
See application file for complete search history.

(56) References Cited

U.S. PATENT DOCUMENTS

| | | | |
|---|---|---|---|
| 4,877,641 A | 10/1989 | Dory | |
| 5,567,661 A | 10/1996 | Nishio et al. | |
| 7,125,758 B2 | 10/2006 | Choi et al. | |
| 7,501,355 B2 | 3/2009 | Bhatia et al. | |
| 7,754,294 B2 | 7/2010 | Choi et al. | |
| 7,785,672 B2 | 8/2010 | Choi et al. | |
| 7,790,635 B2 | 9/2010 | Balseanu et al. | |
| 7,884,035 B2 | 2/2011 | Park et al. | |
| 8,074,599 B2 | 12/2011 | Choi et al. | |
| 8,083,853 B2 | 12/2011 | Choi et al. | |
| 8,328,939 B2 | 12/2012 | Choi et al. | |

(Continued)

FOREIGN PATENT DOCUMENTS

| | | |
|---|---|---|
| EP | 0417170 A1 | 3/1991 |
| JP | 2005-079254 A | 3/2005 |
| WO | 00-03425 A1 | 1/2000 |

OTHER PUBLICATIONS

PCT Search Report and Written Opinion, Patent Application No. PCT/US2007/68063, dated Apr. 8, 2013.

*Primary Examiner* — Jack Chen
(74) *Attorney, Agent, or Firm* — Patterson & Sheridan, LLP (57) ABSTRACT

Methods and apparatus for forming conformal silicon nitride films at low temperatures on a substrate are provided. The methods of forming a silicon nitride layer include performing a deposition cycle including flowing a processing gas mixture into a processing chamber having a substrate therein, wherein the processing gas mixture comprises precursor gas molecules having labile silicon to nitrogen, silicon to carbon, or nitrogen to carbon bonds, activating the precursor gas at a temperature between about 20° C. to about 480° C. by preferentially breaking labile bonds to provide one or more reaction sites along a precursor gas molecule, forming a precursor material layer on the substrate, wherein the activated precursor gas molecules bond with a surface on the substrate at the one or more reaction sites, and performing a plasma treatment process on the precursor material layer to form a conformal silicon nitride layer.

20 Claims, 3 Drawing Sheets

(56) References Cited

U.S. PATENT DOCUMENTS

| | | |
|---|---|---|
| 2006/0005771 A1 | 1/2006 | White et al. |
| 2006/0105106 A1 | 5/2006 | Balseanu et al. |
| 2006/0269693 A1 | 11/2006 | Balseanu et al. |
| 2008/0268175 A1 | 10/2008 | Park et al. |
| 2009/0075490 A1 | 3/2009 | Dussarrat |
| 2009/0255759 A1 | 10/2009 | Barnes |
| 2010/0099236 A1 | 4/2010 | Kwon et al. |
| 2011/0095402 A1 | 4/2011 | Park et al. |
| 2011/0223774 A1 | 9/2011 | Kweskin et al. |
| 2013/0183835 A1* | 7/2013 | Nguyen et al. ............... 438/793 |

* cited by examiner

LOW TEMPERATURE PLASMA ENHANCED CHEMICAL VAPOR DEPOSITION OF CONFORMAL SILICON CARBON NITRIDE AND SILICON NITRIDE FILMS

BACKGROUND OF THE INVENTION

1. Field of the Invention

Embodiments of the present invention generally relate to methods and processes for forming conformal silicon nitride films, including doped silicon nitride films, at low temperatures.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises.

For example, ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors. A CMOS transistor includes a gate structure that is disposed between a source region and a drain region defined in the semiconductor substrate. The gate structure (stack) generally comprises a gate electrode formed on a gate dielectric material.

Transistors may also be formed as 3 dimensional or 3D circuits as compared to traditional planar circuits. 3D transistors may employ gates that form conducting channels on three sides of a vertical "fin" structure, allowing chips to operate at lower voltage with lower leakage. Examples of three dimensional transistors having such gate structures include a FinFET (a nonplanar, double-gate transistor built on a silicon-on-insulator technology substrate, based on the earlier DELTA (single-gate) transistor design) or a Trigate transistor structure.

Conformal coverage with low pattern loading effect of dielectric films on high aspect ratio structures and/or 3D structures are of critical requirement as device node shrinks down to below 45 nm, such as to the 22 nm level, and as the manufacture of 3D transistors increases. Silicon nitride films, including doped silicon nitride, may be used throughout integrated circuit formation, such as gate spacers, liner layers, sacrificial layers, barrier layers, etc. Silicon nitride films, formed using thermal processes offers good conformality. The drawbacks, however, include a high temperature requirement (typically greater than 400° C.) and few capabilities to engineer film compositions and properties for different applications. Alternatively, conventional silane-based plasma enhanced chemical vapor deposition (PE-CVD) silicon nitride films have poorer step coverage due to directionality of radicals' fluxes. Additionally, tuning conformal layers to have desired film properties has also been difficult, particularly as the feature size decreases and the use of non-planar structures increases.

Therefore, there is a need for a low temperature, tunable process to form conformal silicon nitride films on substrates, especially as pattern density and structural aspect ratios increase and device structure sizes decrease.

SUMMARY OF THE INVENTION

The present invention generally provides methods and processes for forming a silicon nitride layer on a substrate. In one embodiment, a method of forming a silicon nitride layer includes performing a deposition cycle including flowing a processing gas mixture into a processing chamber having a substrate therein, wherein the processing gas mixture comprises precursor gas molecules having labile silicon to nitrogen, silicon to carbon, or nitrogen to carbon bonds, activating the precursor gas at a temperature between about 20° C. to about 480° C. by preferentially breaking labile bonds to provide one or more reaction sites along a precursor gas molecule, forming a precursor material layer on the substrate, wherein the activated precursor gas molecules bond with a surface on the substrate at the one or more reaction sites, and performing a plasma treatment process on the precursor material layer to form a conformal silicon nitride layer.

In another embodiment, a method of forming a silicon nitride layer includes flowing a processing gas mixture into a processing chamber having a substrate therein, wherein the processing gas mixture comprises precursor gas molecules having labile silicon to nitrogen, silicon to carbon, or nitrogen to carbon bonds, generating a plasma in the processing chamber at an RF power density from about 0.01 W/cm$^2$ to about 40 W/cm$^2$ and at a temperature between about 20° C. to about 480° C. to activate the precursor gas by preferentially breaking labile bonds to provide one or more reaction sites along a precursor gas molecule, forming a precursor material layer on the substrate, wherein the activated precursor gas molecules bond with a surface on the substrate at the one or more reaction sites, and performing a plasma treatment process on the precursor material layer to form a conformal silicon nitride layer and control the amount of carbon in the conformal silicon nitride film composition. Performing the plasma treatment process includes stopping the flow of the precursor gas molecules and flowing a plasma treatment gas into the processing chamber, wherein the plasma treatment gas comprises ammonia ($NH_3$), hydrazine ($N_2H_4$), helium (He), argon (Ar), xenon (Xe), hydrogen ($H_2$), nitrogen ($N_2$), or combinations thereof. The method also includes repeating the deposition cycle from 1 to 120 times.

In another embodiment, a method of forming a silicon nitride layer includes performing a deposition cycle including flowing processing gas molecules mixture into a processing chamber having a substrate therein, wherein the processing gas mixture comprises precursor gas molecules selected from the group consisting of tetramethylcyclotetrasilazanes, hexamethylcyclotetrasilazenes (HMCTZ), octamethylcyclotetrasilazanes, hexamethyldisilazane (HMDS), bis-diethylamine silane (BDEAS), bis(tertiary-butylamino)silane (BTBAS), tris(dimethylamino)silane (TDMAS), or combinations thereof, generating a plasma in the processing chamber at an RF power density from about 0.01 W/cm$^2$ to about 40 W/cm$^2$ and at a temperature between about 20° C. to about 480° C. to activate the precursor gas by preferentially breaking labile bonds in the precursor gas molecules to provide one or more reaction sites along a precursor gas molecule, forming a precursor material layer on the substrate, wherein the activated precursor gas molecules bonds to a substrate surface at the reaction site, and performing a plasma treatment process on the precursor material layer to form a conformal silicon nitride layer. The method also includes repeating the deposition cycle so that the conformal silicon nitride layer is from about 90 Å to about 110 Å thick and performing a UV cure process on the conformal silicon nitride layer without exposing the silicon nitride layer to oxygen.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein generally provide methods of forming conformal silicon nitride layers on substrates, including conformal doped silicon nitride layers, at low temperatures. The conformal silicon nitride layers may also be tuned to have a desired amount of stress, e.g. compressive or tensile stress, depending on the location, application, and function of the silicon nitride layer on a substrate. The amount of carbon in the silicon nitride layer may also be tuned without affecting conformality of the layer. Conformal silicon nitride layers may serve various purposes during integrated circuit and other microelectronic type of manufacturing. For example, conformal silicon nitride layers may be used as spacers, etch stop layers, liners around the gate or other active device structures, sacrificial layers, strain-inducing layers, copper barrier layers, shallow trench isolation liners to name a few.

Conformality of a layer is typically quantified by a ratio (which may be represented as a percentage) of the average thickness of a layer deposited on the sidewalls of a feature to the average thickness of the same deposited layer on the field, or upper surface, of the substrate. Layers deposited by the methods described herein are observed to have a conformality of greater than about 90%, such as 95% or greater, to about 100%.

Conformal deposition may be improved by utilizing precursors having labile silicon to nitrogen, silicon to carbon, or nitrogen to carbon bonds, activating the precursors at temperatures below 350° C., such as 200° C. and below by preferentially breaking the labile bonds, and plasma treating the deposited layer with gases selected from the group of helium (He), hydrogen ($H_2$), nitrogen ($N_2$), ammonia ($NH_3$), argon (Ar), or combinations thereof. The deposition processes herein may be performed in a suitable processing system.

Figure 1:
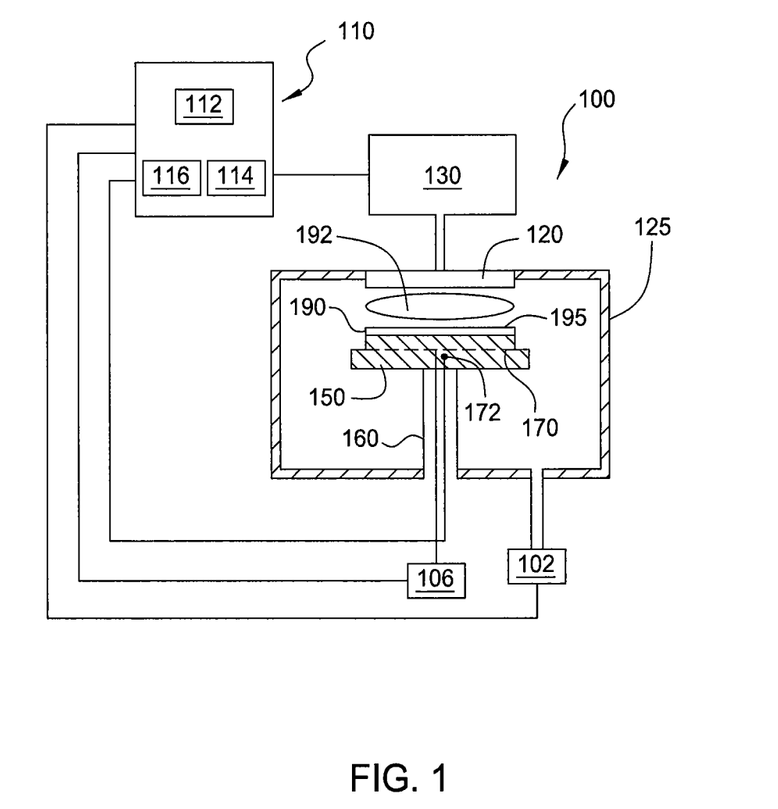
FIG. 1 is a schematic cross-sectional view of an exemplary substrate processing system.

FIG. 1 is a schematic representation of a substrate processing system, system 100, which is programmed for low temperature conformal silicon nitride layer deposition according to embodiments of the present invention. Examples of suitable systems include the CENTURA® systems which may use a DxZ™ processing chamber, PRECISION 5000® systems, PRODUCER™ systems, such as the PRODUCER SE™ processing chamber and the PRODUCER GT™ processing chamber, all of which are commercially available from Applied Materials, Inc., Santa Clara, Calif.

System 100 includes a process chamber 125, a gas panel 130, a control unit 110, and other hardware components such as power supplies and vacuum pumps. The process chamber 125 generally comprises a substrate support pedestal 150, which is used to support a substrate such as a semiconductor substrate 190. This substrate support pedestal 150 moves in a vertical direction inside the process chamber 125 using a displacement mechanism (not shown) coupled to shaft 160. Depending on the process, the semiconductor substrate 190 can be heated to a desired temperature prior to processing. The substrate support pedestal 150 may be heated by an embedded heater element 170. For example, the substrate support pedestal 150 may be resistively heated by applying an electric current from a power supply 106 to the heater element 170. The semiconductor substrate 190 is, in turn, heated by the substrate support pedestal 150. A temperature sensor 172, such as a thermocouple, is also embedded in the substrate support pedestal 150 to monitor the temperature of the substrate support pedestal 150. The measured temperature is used in a feedback loop to control the power supply 106 for the heater element 170. The substrate temperature can be maintained or controlled at a temperature that is selected for the particular process application.

A vacuum pump 102 is used to evacuate the process chamber 125 and to maintain the proper gas flows and pressure inside the process chamber 125. A showerhead 120, through which process gases are introduced into process chamber 125, is located above the substrate support pedestal 150 and is adapted to provide a uniform distribution of process gases into process chamber 125. The showerhead 120 is connected to a gas panel 130, which controls and supplies the various process gases used in different steps of the process sequence. Process gases may are described in more detail below.

The gas panel 130 may also be used to control and supply various vaporized liquid precursors. While not shown, liquid precursors from a liquid precursor supply may be vaporized, for example, by a liquid injection vaporizer, and delivered to process chamber 125 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may also form a pair of spaced electrodes. When an electric field is generated between these electrodes, the process gases introduced into chamber 125 are ignited into a plasma 192. Typically, the electric field is generated by connecting the substrate support pedestal 150 to a source of single-frequency or dual-frequency radio frequency (RF) power (not shown) through a matching network (not shown). Alternatively, the RF power source and matching network may be coupled to the showerhead 120, or coupled to both the showerhead 120 and the substrate support pedestal 150.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 130 is performed by mass flow controllers (not shown) and a control unit 110 such as a computer. The showerhead 120 allows process gases from the gas panel 130 to be uniformly distributed and introduced into the process chamber 125. Illustratively, the control unit 110 comprises a central processing unit (CPU) 112, support circuitry 114, and memories containing associated control software 116. This control unit 110 is responsible for automated control of the numerous steps required for substrate processing, such as substrate transport, gas flow control, liquid flow control, temperature control, chamber evacuation, and so on. When the process gas mixture exits the showerhead 120, plasma enhanced activation of the precursor gas occurs, resulting in the deposition of a precursor on the surface 195 of semiconductor substrate 190.

Deposition Process

Aspects of the invention provide for low temperature conformal deposition of a silicon nitride ($Si_xN_y$) layer. Aspects of the invention also include deposition processes for low temperature conformal doped silicon nitride layers, such as carbon doped silicon nitride ($Si_xN_y$:C). Low temperature conformal deposition may be achieved by processes utilizing a processing gas mixture introduced into a processing chamber, where the processing gas mixture includes precursors having nitrogen and silicon, i.e. the precursor gas compounds have both nitrogen and silicon. The precursor gases have labile silicon to nitrogen, silicon to carbon, or nitrogen to carbon bonds. The precursor gases are activated, at least partially, to form a limited number of active or reaction sites along the precursor gas compound by preferentially breaking the labile bonds. The active site of the precursor gas bonds with a surface on the substrate to form a precursor material layer on the substrate. A plasma treatment process is then performed on the precursor material layer to form a conformal silicon nitride layer.

It is believed that the processes described herein provide for a self-limiting reaction state and/or self-saturating reaction/deposition process when forming the silicon nitride layer, thereby providing a more conformal deposition process. Additionally, the low temperature conformal silicon nitride layers have a high step coverage and low pattern loading effect. As defined herein, layers with a high step coverage have a lower percentage of layer thickness difference between different surfaces of a feature, i.e., sidewalls, top, and bottom, than layers with low step coverage. The pattern loading effect (PLE) is defined as the percentage of layer thickness difference between a layer thickness on portion, such as the bottom, top, or sidewall, of a feature in a substrate region with a few features (an isolated area) and a layer thickness on a corresponding portion of a feature in a substrate region with high density of features (a dense area), and thus, a lower pattern loading effect percentage reflects a higher layer thickness uniformity across a substrate.

According to an embodiment, a conformal silicon nitride layer is formed using a deposition cycle having various processes. The deposition cycle includes flowing a processing gas mixture into a processing chamber having a substrate therein, such as process chamber 125 and substrate 190 previously described in conjunction with FIG. 1. The processing gas mixture includes at least one precursor gas having silicon and nitrogen, i.e. the precursor gas has compounds containing both silicon and nitrogen.

The precursors may comprise compounds having labile silicon to nitrogen, silicon to carbon, or nitrogen to carbon bonds. The precursors may also include hydrocarbon groups, such as methyl and ethyl groups. Some examples of suitable precursors include substituted silazanes, substituted silanes, or combinations thereof. Substituted silazanes are compounds having a Si—N backbone and various organic substitutions on the Si, such as alkyl groups. Substituted silanes are compounds having a Si—N backbone with various organic substitutions on N. The organic substitutions along these molecules tend to be the labile group(s) in these compounds, whose labile bonds are broken during activation of the precursor gas or gases.

The substituted silazanes may be cyclic or linear. Suitable cyclic silazanes include one or more of the following compounds, for example tetramethylcyclotetrasilazanes, hexamethylcyclotetrasilazanes (HMCTZ), and octamethylcyclotetrasilazanes, or combinations thereof. Some specific examples of cyclic silazanes include 1,2,3,4 tetramethylcyclotetrasilazane, 1,1,3,3 tetramethylcyclotetrasilazane, 1,1,3,3,5,5 hexamethylcyclotetrasilazane, 1,2,3,4,5,6 hexamethylcyclotetrasilazane, 1,1,3,3,5,5,7,7 octamethylcyclotetrasilazen, and 1,2,3,4,5,6,7,8 octamethylcyclotetrasilazane. Suitable linear silazanes include hexamethyldisilazane (HMDS). Suitable substituted silanes may include bis-diethylamine silane (BDEAS), bis(tertiary-butylamino)silane (BTBAS), and tris (dimethylamino)silane (TDMAS). Any of the precursor compounds may be used alone or in combination with other precursor compounds.

The processing gas mixture may include other process gases besides the precursor gases such as carrier or other types of gases. For example, the other process gases may include ammonia ($NH_3$), hydrazine ($N_2H_4$), helium (He), argon (Ar), hydrogen ($H_2$), nitrogen ($N_2$), xenon (Xe), and combinations thereof. He, $N_2$, and Ar may be used as carrier gases. Ar, Xe, and He may also help activate the precursor molecules and enable lower power deposition, which may be desirable if there are materials on the substrate sensitive to high bombardment i.e. high plasma power. Ar and Xe are desirable when low power plasma is used, such as <1 W/cm², due to their ability to ionize easily and maintain plasma stability. Ar and Xe, however, may be less desirable to use in the processing gas mixture at higher power because they may be too reactive in a plasma state and induce excessive dissociation of the precursor molecule (instead of just assisting the breakage of the labile bonds).

The silicon nitride deposition process also includes activating the precursor gas compounds to form a limited number of reaction sites, such as a single reaction site, along the precursor gas compound by preferentially breaking one or more of the labile bonds in the precursor gas compound. The precursor gas compounds are controllably activated so that the bonds within the compound are not completely broken. As one or more of the labile bonds are preferentially broken, only a few reaction sites are formed, such as a single site, along the long chain radicals created during activation of the precursor compounds, such as if a hydrocarbon group left the compound. The precursor compound is therefore mostly inactive, and can react on a surface of the substrate only at a specific location along the compound. It is believed that this provides more mobility to the precursor compound to move along the surface of the substrate until it finds a location along the surface with which it can react. A precursor material layer is formed on the substrate wherein the precursor gas compound bonds and/or reacts with a surface on the substrate at the reaction site.

It is believed that the reaction of the precursor compound with the substrate surface is self-limiting because of the few reaction sites along the compound. It is believed that this self-limiting nature of the process helps form the conformal silicon nitride layer. The precursor material layer so formed on the substrate surface may be a mono-layer or may be less than a monolayer i.e. a sub-monolayer. It is believed that the precursor material layer may be less than a monolayer because the activated precursor compounds are so big that they do not completely cover the surface of the substrate. When the activated precursor compounds can no longer bond with the substrate surface, a self-saturating regime occurs where the activated precursor compounds will try to bond with the surface but will not react with itself.

Activation of the compound may occur by generating a plasma in the processing chamber at an RF power density from about 0.01 W/cm² to about 40 W/cm². The degree to which the precursor compounds are activated may be adjusted by the power density so that only a few, and in some cases a single, active site is formed along the precursor compound. It is believed that the amount of thermal energy required to form the conformal silicon nitride layers is considerably reduced because of the ability to control the degree of activation of the precursor compounds.

The deposition process temperature during activation of the precursor compound may be from about 20° C. to about 480° C. For example, the temperature may be less than 300° C., such as from about 50° C. and about 200° C., such as about 100° C. or 150° C. In conventional thermal processes for forming conformal silicon nitride films, a furnace is used because a higher temperature is required, typically greater than 600° C., and the film is generally deposited conformally because there is no directionality on the gas flow of a thermal process.

Under typical plasma processes, however, a non-conformal film forms because plasma processes are usually directional, which directionality typically inhibits or hampers the ability to form conformal films. Such non-conformal silicon nitride films may exhibit a "mushroom" effect in the corner of a structure on which the film is formed because of the directionality of the plasma enhanced gases.

It is believed, however, that low temperature conformal deposition of silicon nitride is enabled by activating certain types of molecules, such as via a plasma enhanced process, so that there are few active sites along the molecule as previously described, which contributes to the conformal deposition of the silicon nitride film even though at low temperatures and under plasma enhanced conditions.

Next in the deposition cycle, a plasma treatment process is performed on the precursor material layer to form a conformal silicon nitride layer. The plasma treatment process includes flowing a plasma treatment gas into the processing chamber. The precursor gas flow may be shut off during the plasma treatment process and any of the other gases in the processing gas mixture may continue to flow, or stopped and other plasma treatment gases used. Under these plasma conditions, it is believed that the precursor layer on the surface of the substrate is cross-linked in certain configurations and numbers to form a Si—N—Si network, thereby forming a conformal silicon nitride film. It is believed that the plasma treatment reacts with N—H bonds on the surface and prepares the surface for the next layer of precursor material.

The plasma treatment gases may include some of the same gases that are already present in the processing gas mixture. The plasma treatment gas may include ammonia ($NH_3$), hydrazine ($N_2H_4$), helium (He), argon (Ar), hydrogen ($H_2$), nitrogen ($N_2$), Xenon (Xe), and combinations thereof. The type of plasma treatment gas or gasses and the plasma treatment processing conditions are modified to achieve desired film properties in the conformal silicon nitride layer. For example, $H_2$ addition to the plasma treatment preferentially dissociates C—H bonds leading to formation of a Si—C—Si network. $NH_3$ addition to the plasma treatment, however, will enable carbon removal from the film by assisting the breaking of Si—$CH_x$ bonds and formation of new Si—N—Si network. Ar, Xe, and He may be used as diluents in the plasma to help control plasma density.

Table 1 below shows ranges of the gas flow rates for the precursor deposition process and the plasma treatment process. Exemplary process parameters are shown in the parenthesis. The processes were carried out using a 300 mm substrates.

Table 2 below shows ranges of the other process parameters for the precursor deposition process and the plasma treatment process. Specific exemplary process parameters are shown in the parenthesis.

TABLE 2

| Process Parameters (Example) | Power Density ($W/cm^2$) | RF Frequency (kHz-MHz) | Temperature (° C.) | Pressure (Torr) | Time (Sec.) |
|---|---|---|---|---|---|
| Precursor Deposition Process | 0.01-40 (.05) | 100 kHz-75 MHz (e.g. 13.6 MHz or 60 MHz) | 20-350 (200) | 0.5-60 (6) | 15 |
| Plasma Treatment Process | 0.01-40 (5) | 100 kHz-75 MHz (e.g. 13.6 MHz or 60 MHz) | 20-350 (200) | 0.5-60 (6) | 15 |

Not only does the plasma treatment process cross-link neighboring precursor molecules that are bonded with the substrate surface, but the plasma treatment process can also be used to tailor and control various desired film properties in the silicon nitride layer, such as composition, refractive index, stress, wet etch selectivity, carbon bonding in the film (e.g. Si—C network vs. Si—C—C—Si vs. Si—N), wet etch rate (WER), and electrical properties. It is believed that wet etch rate generally scales with carbon content such that the higher the carbon content the lower the wet etch rate. The refractive index is a result of the film composition and density.

The plasma treatment process may be used to control the amount of carbon in the conformal silicon nitride layer, such as by controlling the duration of the plasma treatment process and/or the type of plasma treatment gas or gases used. For example, if more nitrogen is desired in the conformal silicon nitride film, then ammonia or nitrogen may be used as the primary plasma treatment gas. If a carbon doped conformal silicon nitride film is desired, then hydrogen may be used as the primary plasma treatment gas. For example, the conformal silicon nitride film may have anywhere from no carbon to a film with 30-40% carbon and still maintain conformality. Conventional SiCN films were difficult if not impossible to have high conformality because of the low mobility and high sticking coefficient of the carbon-containing radicals present during plasma deposition. The deposition cycle may then be repeated to increase the thickness of the conformal silicon nitride layer. A single deposition cycle typically deposits a conformal silicon nitride film that is about 3 angstroms (Å) thick and may be as high as 5 Å thick. The deposition cycle may then be repeated a certain number of times or until a desired thickness of the conformal silicon nitride layer is reached. For example, the deposition cycle may be repeated from 2 to 120 times, such as 30 times or 50 times. Additionally, the deposition cycle may be repeated until the conformal silicon nitride layer is from about 5 Å to about 300 Å thick, such as about from 90 Å to about 110 Å, such as about 100 Å thick. In some instances, the deposition cycle may be repeated

TABLE 1

| Gas Flow Rate Ranges (Example) | Precursor (mg/min.) | $NH_3$ (sccm) | He (sccm) | Ar (sccm) | $H_2$ (sccm) | $N_2$ (sccm) |
|---|---|---|---|---|---|---|
| Precursor Deposition Process | 2-5000 (1000) | .005-20,000 (2,000) | 0.1-20,000 (2,000) | 0.1-20,000 (8,000) | 0.1-20,000 (4,000) | 0.1-20,000 (4,000) |
| Plasma Treatment Process | 0 | .005-20,000 (4,000) | 0.1-20,000 (5,000) | 0.1-20,000 (8,000) | 0.1-20,000 (4,000) | 0.1-20,000 (8,000) | until a conformal silicon nitride layer is about 500 Å thick, which may require from about 100-170 deposition cycles depending on the thickness of each layer.

Table 3 below shows the effect various plasma treatments have on the conformal silicon nitride film.

TABLE 3

| Treatment Gas | C % | WER (Å/min) (100:1 DHF) |
|---|---|---|
| Hydrogen | 20% | <1 Å/min |
| Nitrogen | 10% | >250 Å/min |
| Ammonia | <1% | 100 Å/min |

The plasma treatment process may also be used to tune the stress of the conformal silicon nitride layer, such as when forming a compressive stressed conformal silicon nitride layer. By increasing the ion bombardment during the plasma treatment process, the conformal silicon nitride layer can be tuned to have a compressive stress.

The plasma treatment process may also be used in combination with a UV cure process to tune the stress of the conformal silicon nitride layer. The UV cure process generally is not needed after every silicon nitride layer is deposited, as it has a more bulk type effect. Typically, the UV cure process may be done every 90-110 Å of conformal silicon nitride film formed. For example, the plasma treatment process combined with a UV cure process may provide a conformal silicon nitride layer having compressive stress. An $NH_3$ plasma treatment removes carbon that may be formed in the silicon nitride, thereby leaving the conformal silicon nitride film with a lot of hydrogen. A UV cure process following the plasma treatment process may remove the hydrogen, making strained S—N bonds by breaking Si—H and N—H bonds and forming new Si—N bonds. In that manner, a conformal low temperature silicon nitride film having tensile stress may be formed.

The UV cure process may be performed in the same chamber as the deposition chamber or in a chamber which is part of an integrated tool that includes the deposition chamber in which the silicon nitride layer was deposited. For example, the UV cure process may be performed in a NANOCURE™ chamber that is part of a PRODUCER® platform that includes a PECVD chamber in which the silicon nitride layer is deposited. The UV cure process may be performed on the conformal silicon nitride layer without exposing the silicon nitride layer to oxygen. For example, the UV cure process may be performed in an integrated platform so that no vacuum break occurs between deposition, plasma treatment, and UV cure processes.

Exemplary UV cure process conditions that may be used include a chamber pressure of between about 0.5 Torr and about 8 Torr and a substrate support temperature of between about 20° C. and about 650° C., such as between about 400° C. and about 480° C. The substrate support temperature for the UV cure process may be greater than, less than, or equal to the substrate support temperature during the deposition process.

The UV cure process may use a processing gas comprising an inert gas, a nitrogen-containing gas, a hydrogen gas, or combinations thereof, which may be introduced into the chamber at a flow rate of between about 0.5 slm and about 50 slm during the treatment, such as about 16 slm. Exemplary gases include He, $H_2$, $N_2$, Ar, and combinations thereof. The processing gas may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The UV radiation may have a single wavelength, such as 173 nm. Alternatively, the UV radiation may be provided by a broad band UV source that provides wavelengths greater than 200 nm. The treatment may comprise exposing the deposited material to between about 1 Watt/cm$^2$ and about 1000 Watts/cm$^2$ of ultraviolet radiation, and the ultraviolet radiation may provide a photon energy (electronVolts) between about 0.5 eV and about 10 eV, such as between about 1 eV and about 6 eV.

Films formed according to embodiments of the invention have shown a conformality of 95% step coverage and PLE 5%, while also tuning the desired amount of carbon in the film. It is believed that the good loading effect is due to the fact that even though the plasma enhanced process produces more flux of the gas radicals, they are mostly inactive since they have few active sites for bonding previously described. So even if there is more flux in one area of the processing chamber, the activated precursor cannot physically stay there as it doesn't have a site to adhere e.g. the precursor molecules cannot stack up on each other, even with a really dense structural pattern absorbing a lot of material. Thus, conformal coverage of the silicon nitride occurs with low pattern loading effect (PLE), even as devices shrink below 45 nm and aspect ratios structures increase.

Conformal silicon nitride films formed according to the embodiments described herein may be used as liners, spacers, stain-inducing layers, etc. Two particular types of applications will be described that may benefit from the low temperature conformal silicon nitride films described herein.

Figure 2A:
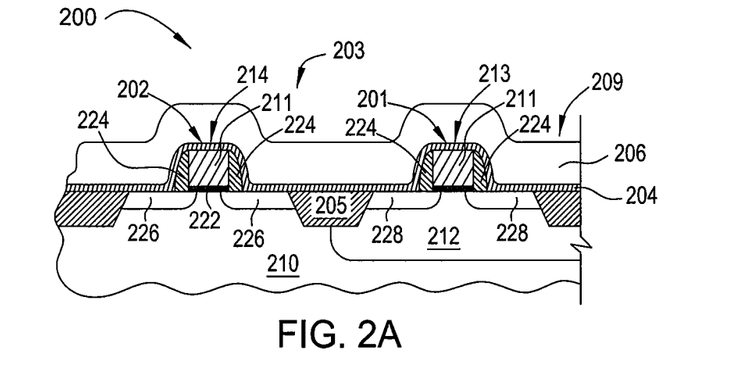
FIGS. 2A-2B are side cross-sectional views that schematically illustrate different stages of a metal gate formation process.
Figure 2B:
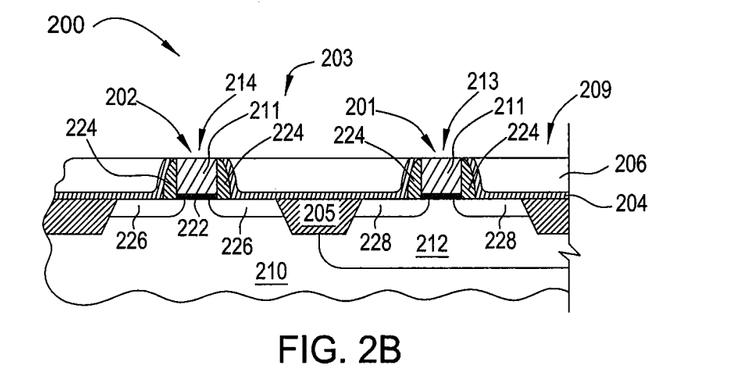

FIGS. 2A-2B depict side cross-sectional views of a device 200 that schematically illustrates different stages of a metal gate formation process used to form PMOS and NMOS metal gates in complementary metal oxide semiconductor (CMOS) devices 201, 202 formed on a substrate. The metal gate formation stage of a device formation process can be performed in many different ways depending on the desired gate formation processing sequence, such as a gate first or gate last metal gate formation sequence. FIG. 2A schematically illustrates a stage of a replacement gate style formation sequence (i.e., gate last type sequence) in which formed dummy gates 211 (e.g., polysilicon dummy gate) are disposed in each of the gate regions (e.g., PMOS gate region 213 and NMOS gate region 214) of the PMOS device 201 and NMOS device 202. Only a portion of the gate replacement process is shown in order to illustrate applications for low temperature conformal silicon nitride films.

In this example, the CMOS device 203 comprises a PMOS device 201 and an NMOS device 202 that are separated by a field isolation region 205 formed on a portion of a substrate 210. As illustrated in FIGS. 2A and 2B, the partially formed PMOS device 201 generally comprises a PMOS gate region 213 that includes a gate oxide 222, spacers 224, and a poly gate 211 that are disposed between the source-and-drain-regions 228 that are disposed in an n-well region 212 formed in the substrate 210. The partially formed NMOS device 202 generally comprises a NMOS gate region 214 that includes a gate oxide 222, spacers 224, and a poly gate 211 that are disposed between the source-and-drain-regions 226 that are disposed in the substrate 210. It should be noted that while the NMOS devices and PMOS devices are similarly illustrated and use common reference numerals in the schematic diagrams shown in FIGS. 2A-2B, this is not intended to be limiting as to the scope of the invention described herein, since each device may be configured differently.

A pre-metal dielectric layer 206 is formed over the NMOS and PMOS devices. The pre-metal dielectric layer 206 may be made of $SiO_2$ and formed using TEOS in a PECVD process. A liner layer 204 may be formed between the pre-metal dielectric layer 206 and the PMOS and NMOS devices as shown in FIG. 2A. The liner layer 204 may comprise a low temperature conformal silicon nitride film formed according to the various processes disclosed herein. The liner layer 204 may be configured to function as a CMP stop layer when polishing the device 200 in order to "open up" the poly gate 211 as shown in FIG. 2B in order to begin the gate replacement process.

Figure 3A:
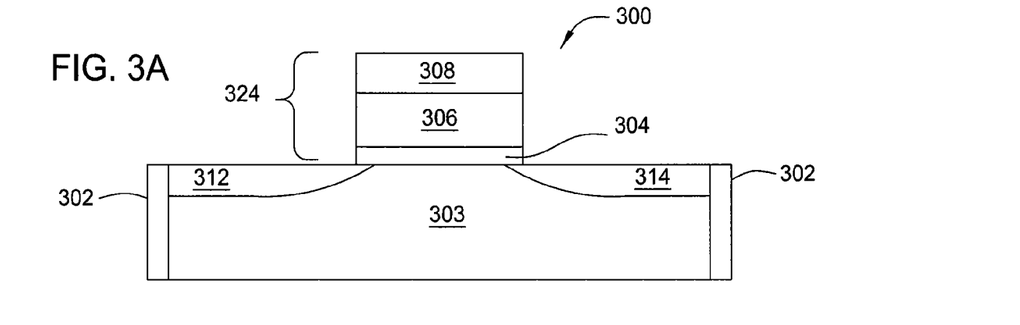
FIGS. 3A-3C are side cross-sectional views that schematically illustrate different stages of a gate formation process.
Figure 3B:
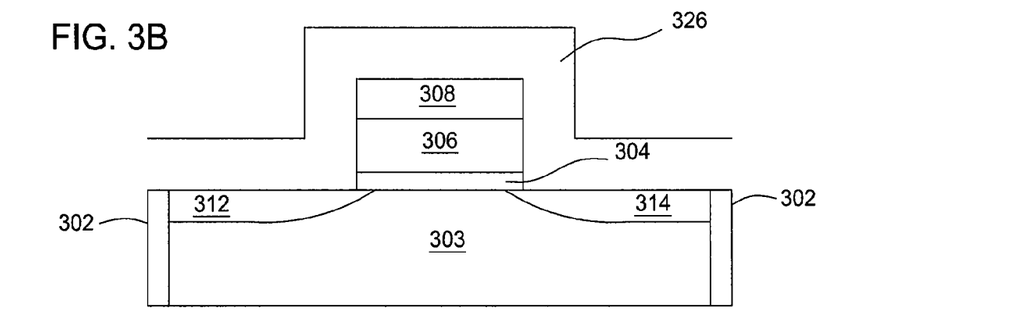
Figure 3C:
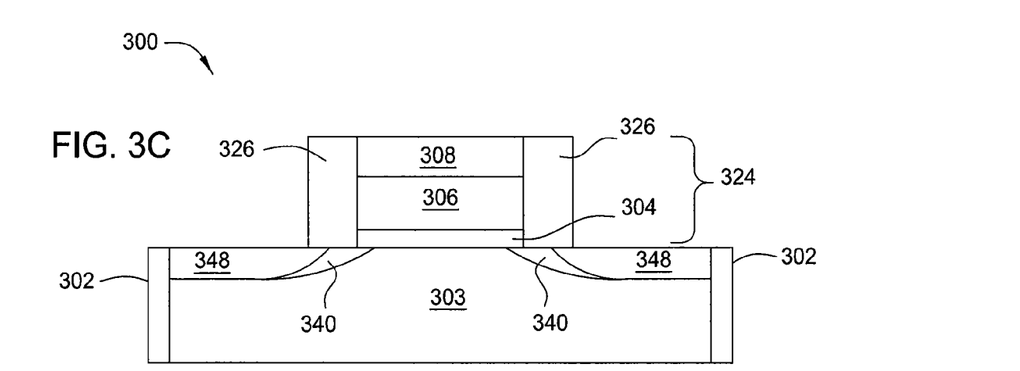

Another application that may use the low temperature conformal silicon nitride film formed according to embodiments described herein is a gate spacer. FIGS. 3A-3C illustrate an integration scheme that includes a low temperature conformal silicon nitride containing material spacer layer. FIG. 3A shows a transistor structure 300 on a substrate (not shown). The transistor structure 300 comprises a gate stack 324. The gate stack 324 includes a gate dielectric layer 304 and a gate electrode layer 306. Typically, gate dielectric layer 304 may be formed by depositing or growing a layer of a material such as silicon oxide ($SiO_n$) and/or silicon oxynitride, which form layers having a dielectric constant less than about 5.0. Advances in gate dielectric technology indicate that higher dielectric constant materials (K>10) are desirable for forming the gate dielectric layer 304.

Generally, the gate electrode layer 306 may comprise a material such as, but not limited to, doped polysilicon, undoped polysilicon, silicon carbide, or silicon-germanium compounds. Contemplated embodiments, however, may encompass a gate electrode layer 306 containing a metal, metal alloy, metal oxide, single crystalline silicon, amorphous silicon, silicide, or other material well known in the art for forming gate electrodes.

A hard mask layer 308 is formed on the gate electrode layer 306. The gate stack 324 is between source region 312 and drain region 314. Field isolation regions 302 formed in the structure isolate a well 303 of one type of conductivity, for example, an n-type (NMOS), from adjacent wells (not shown) of another type of conductivity, for example, p-type. The gate electrode layer 306 and the gate dielectric layer 304 together define a composite structure, sometimes known as a gate stack 324, or gate, of an integrated device, such as a transistor, as shown in FIG. 3A.

Referring to FIG. 3B, a spacer layer 326, with thickness in the range between about 200 Å to about 1000 Å, preferably between about 400 Å to about 800 Å, is blanket deposited over the top of the gate stack 324 and along the entire length of the sides of the gate stack 324, including the entire length of the sidewalls of the gate electrode layer 306 and the gate dielectric layer 304. At the same time, the spacer layer 326 is deposited on top of any exposed portion of the substrate 300 or isolation regions 302. The spacer layer 326 may comprises one or more nitride layers, such as the low temperature conformal carbon doped silicon nitride layers described herein.

The spacer layer 326 is then etched to remove the spacer layer 326 from the top of the gate electrode layer 306 as well as from the top surface of the isolation regions 302 and from most of the top surface of the substrate 300 except immediately adjacent the gate stack 324 as shown in FIG. 3C. In one embodiment of the etch process, the spacer layer is etched by an anisotropic etch to leave a portion of the spacer layer 326 along the entire length of the sidewalls of both the gate electrode layer 306 and the gate dielectric layer 304, thus forming a sidewall spacer layer 326.

In further processing of the transistor, tips, or shallow source/drain extensions, 340, are formed by utilizing a tip implant process. Next, the substrate 300 is subjected to a deep, high dose implant process to form deep junction source/drain regions 348 in the well region 303. The deep implant includes implanting ions with the same conductivity type impurities used to form the source/drain extensions 340.

The foregoing embodiments of a transistor structure and method of its formation are merely illustrative. Additional embodiments of gate electrodes and alternative methods for their formation may be employed to practice the invention.

Example 1

A conformal silicon nitride layer may be deposited on a 300 mm substrate by a PECVD process. The substrate and the substrate pedestal were heated to a temperature of about 200° C. The substrate was exposed to a hydrocarbon precursor having silicon and nitrogen, $C_6H_{21}N_3Si_3$ (HMCTZ) and a He carrier gas under plasma conditions. The deposition plasma was generated at 50 watts for 10 seconds. The precursor gas had a flow rate of about 1000 mg/min. After forming a precursor material layer, the precursor gas flow was stopped and the substrate exposed to a plasma treatment process including $H_2$ gas for 10 seconds. The plasma treatment gas had a flow rate of about 5 slm. The treatment plasma was generated at 500 watts for 10 seconds. The silicon nitride material was deposited on the substrate to a final thickness of about 500 Å by 100 cycles of about 5 Å per cycle. The composition analysis of the conformal silicon nitride material provided conformality of 95% and PLE of 5%, and a carbon content of 16 atomic (at) %.

Example 2

A conformal silicon nitride layer may be deposited on a 300 mm substrate by a PECVD process. The substrate and the substrate pedestal were heated to a temperature of about 200° C. The substrate was exposed to a hydrocarbon precursor having silicon and nitrogen, $C_6H_{21}N_3Si_3$ (HMCTZ) and a He carrier gas under a plasma conditions. The deposition plasma was generated at 50 watts for 10 seconds. The precursor gas had a flow rate of about 1000 mg/min. After forming a precursor material layer, the precursor gas flow was stopped and the substrate exposed to a plasma treatment process including $NH_3$ gas for 15 seconds. The plasma treatment gas had a flow rate of about 10 slm. The treatment plasma was generated at 500 watts for 15 seconds. The silicon nitride material was deposited on the substrate to a final thickness of about 450 Å by 100 cycles of about 4.5 Å per cycle and the composition analysis showed <2% carbon content and conformality of greater than 90% and PLE of 5%.

A UV cure process was performed on the substrate using a He gas at 6 Torr and a temperature of 400° C. for 120 seconds. The film analysis showed a stress of 500 GPa and a carbon content of <2% C atomic weight.

While the foregoing is directed to embodiments of the present invention, other and further embodiments of the invention may be devised without departing from the basic scope thereof, and the scope thereof is determined by the claims that follow.

The invention claimed is:

1. A method of forming a silicon nitride layer, comprising:
performing a deposition cycle, comprising:
flowing a processing gas mixture into a processing chamber having a substrate therein, wherein the processing gas mixture comprises precursor gas molecules having labile silicon to nitrogen, silicon to carbon, or nitrogen to carbon bonds;
activating the precursor gas at a temperature between about 20° C. to about 480° C. by preferentially breaking labile bonds to provide one or more reaction sites along a precursor gas molecule;
forming a precursor material layer on the substrate, wherein the activated precursor gas molecules bond with a surface on the substrate at the one or more reaction sites; and
performing a plasma treatment process on the precursor material layer to form a conformal silicon nitride layer.

2. The method of claim 1, wherein activating the precursor gas further comprises:
generating a plasma in the processing chamber at an RF power density from about 0.01 W/cm$^2$ to about 40 W/cm$^2$.

3. The method of claim 2, wherein the temperature is less than 300° C.

4. The method of claim 1, wherein the precursor gas is selected from the group consisting of substituted silazanes, substituted silanes, or combinations thereof.

5. The method of claim 4, wherein the substituted silazanes comprises tetramethylcyclotetrasilazanes, hexamethylcyclotetrasilazanes (HMCTZ), octamethylcyclotetrasilazanes, hexamethyldisilazane (HMDS), or combinations thereof.

6. The method of claim 4, wherein the substituted silanes comprises bis-diethylamine silane (BDEAS), bis(tertiary-butylamino)silane (BTBAS), tris(dimethylamino)silane (TDMAS), or combinations thereof.

7. The method of claim 1, wherein the plasma treatment process cross-links the precursor gas compounds in the precursor material layer.

8. The method of claim 1, wherein the deposition cycle is repeated from 1 to 120 times.

9. The method of claim 1, wherein the processing gas mixture further comprises ammonia (NH$_3$), hydrazine (N$_2$H$_4$), helium (He), argon (Ar), xenon (Xe), hydrogen (H$_2$), nitrogen (N$_2$), or combinations thereof.

10. The method of claim 1, wherein the performing the plasma treatment process comprises:
stopping the flow of the precursor gas molecules; and
flowing a plasma treatment gas into the processing chamber, wherein the plasma treatment gas comprises ammonia (NH$_3$), hydrazine (N$_2$H$_4$), helium (He), argon (Ar), xenon (Xe), hydrogen (H$_2$), nitrogen (N$_2$), or combinations thereof.

11. The method of claim 10, wherein the conformal silicon nitride layer is doped with carbon.

12. The method of claim 11, wherein controlling the duration of the plasma treatment process controls the amount of carbon in the silicon nitride layer.

13. The method of claim 1, further comprising:
performing a UV cure process on the conformal silicon nitride layer without exposing the silicon nitride layer to oxygen.

14. The method of claim 1, wherein the conformal silicon nitride layer has a conformality of 90% or greater.

15. A method of forming a silicon nitride layer, comprising:
performing a deposition cycle, comprising:
flowing a processing gas mixture into a processing chamber having a substrate therein, wherein the processing gas mixture comprises precursor gas molecules having labile silicon to nitrogen, silicon to carbon, or nitrogen to carbon bonds;
generating a plasma in the processing chamber at an RF power density from about 0.01 W/cm$^2$ to about 40 W/cm$^2$ and at a temperature between about 20° C. to about 480° C. to activate the precursor gas by preferentially breaking labile bonds to provide one or more reaction sites along a precursor gas molecule;
forming a precursor material layer on the substrate, wherein the activated precursor gas molecules bond with a surface on the substrate at the one or more reaction sites; and
performing a plasma treatment process on the precursor material layer to form a conformal silicon nitride layer and control the amount of carbon in the conformal silicon nitride film composition, wherein performing the plasma treatment process comprises:
stopping the flow of the precursor gas molecules; and
flowing a plasma treatment gas into the processing chamber, wherein the plasma treatment gas comprises ammonia (NH$_3$), hydrazine (N$_2$H$_4$), helium (He), argon (Ar), xenon (Xe), hydrogen (H$_2$), nitrogen (N$_2$), or combinations thereof; and
repeating the deposition cycle from 1 to 120 times.

16. The method of claim 15, wherein activating the precursor gas provides a single reaction site along the precursor gas molecule.

17. The method of claim 15, wherein the precursor gas is selected from the group consisting of tetramethylcyclotetrasilazanes, hexamethylcyclotetrasilazanes (HMCTZ), octamethylcyclotetrasilazanes, hexamethyldisilazane (HMDS), bis-diethylamine silane (BDEAS), bis(tertiary-butylamino) silane (BTBAS), tris(dimethylamino)silane (TDMAS), or combinations thereof.

18. A method of forming a silicon nitride layer, comprising:
performing a deposition cycle, comprising:
flowing processing gas molecules mixture into a processing chamber having a substrate therein, wherein the processing gas mixture comprises precursor gas molecules selected from the group consisting of tetramethylcyclotetrasilazanes, hexamethylcyclotetrasilazanes (HMCTZ), octamethylcyclotetrasilazanes, hexamethyldisilazane (HMDS), bis-diethylamine silane (BDEAS), bis(tertiary-butylamino)silane (BTBAS), tris(dimethylamino) silane (TDMAS), or combinations thereof;
generating a plasma in the processing chamber at an RF power density from about 0.01 W/cm$^2$ to about 40 W/cm$^2$ and at a temperature between about 20° C. to about 480° C. to activate the precursor gas by preferentially breaking labile bonds in the precursor gas molecules to provide one or more reaction sites along a precursor gas molecule;
forming a precursor material layer on the substrate, wherein the activated precursor gas molecules bonds to a substrate surface at the reaction site; and
performing a plasma treatment process on the precursor material layer to form a conformal silicon nitride layer;

repeating the deposition cycle so that the conformal silicon nitride layer is from 90 Å to about 110 Å thick; and performing a UV cure process on the conformal silicon nitride layer without exposing the silicon nitride layer to oxygen.

19. The method of claim 18, wherein the plasma treatment process cross-links the precursor gas molecules in the precursor material layer and wherein the UV cure process tunes the amount of stress in the conformal silicon nitride layer.

20. The method of claim 18, wherein the conformal silicon nitride layer is doped with carbon.

* * * * *